United States Patent [19]

Katayama et al.

[11] Patent Number: 5,070,041

[45] Date of Patent: Dec. 3, 1991

[54] METHOD OF REMOVING FLASH FROM A SEMICONDUCTOR LEADFRAME USING COATED LEADFRAME AND SOLVENT

[75] Inventors: Shigeru Katayama; Kaoru Tominaga; Toshio Suetsugu; Kazumi Matsumoto, all of Ichihara, Japan

[73] Assignee: Mitsui Petrochemical Industries, Ltd., Tokyo, Japan

[21] Appl. No.: 391,986

[22] Filed: Aug. 10, 1989

[30] Foreign Application Priority Data

Aug. 12, 1988 [JP] Japan ................ 63-201464
Aug. 31, 1988 [JP] Japan ................ 63-219488
Sep. 13, 1988 [JP] Japan ................ 63-228957

[51] Int. Cl.$^5$ .................................. H01L 21/56
[52] U.S. Cl. ........................ 437/214; 357/70; 437/215
[58] Field of Search ............ 437/214, 217, 219, 207, 437/210, 225, 220, 224

[56] References Cited

FOREIGN PATENT DOCUMENTS

| 0084424 | 7/1983 | European Pat. Off. . |
| 0211618 | 2/1987 | European Pat. Off. . |
| 0213764 | 3/1987 | European Pat. Off. . |
| 0273556 | 7/1988 | European Pat. Off. . |
| 55-003611 | 1/1980 | Japan . |
| 56-094636 | 7/1981 | Japan . |
| 56-062347 | 8/1981 | Japan . |
| 60-152033 | 8/1985 | Japan . |
| 61-28313 | 4/1986 | Japan . |
| 61-283134 | 12/1986 | Japan . |
| 62-14916 | 1/1987 | Japan . |
| 63-17243 | 2/1988 | Japan . |
| 172432 | 7/1988 | Japan . |

OTHER PUBLICATIONS

6th IEEE/CHMT International Electronic Manufctg. Techn. Symposium, Nara. 26th-28th Apr., 1989, pp. 59-64, H. Shiguya et al.
Solid State Technology, vol. 31, No. 6, Jun. 1988, pp. 75-80, Port Washington, N.Y., Bregman et al.
23rd Annual Proceedings, Reliability Physics, 1985, Orlando, Fla., 26th-28th Mar., 1985, pp. 184-191, Groothuis et al.

Primary Examiner—Olik Chaudhuri
Assistant Examiner—David E. Graybill
Attorney, Agent, or Firm—Birch, Stewart, Kolasch & Birch

[57] ABSTRACT

In accordance with the present invention, semiconductor devices are produced by the process involving the steps of obtaining a core-box resin molded item integrated with a lead frame by coating said lead frame on its portions expected to be in non-contact with said core-box resin molded item with an organic high molecular substance having a melting or softening point higher than the molding temperature of the resin constituting said core-box resin molded item and soluble in a solvent which does not dissolve said core-box resin molded item, placing the thus coated lead frame in position within a mold and injecting the resin into the mold thereby carrying out injection or transfer molding and immersing the lead frame bearing core-box resin molded item obtained in the foregoing step in said solvent to remove by dissolving said organic high molecular substance. On that account, flashes of the resin formed on the lead frame can be removed with facility or the formation of said flashes can be suppressed without damaging the resin molded portion, whereby a good electrical connection between the lead frame and the semiconductor element can be accomplished.

12 Claims, 1 Drawing Sheet

METHOD OF REMOVING FLASH FROM A SEMICONDUCTOR LEADFRAME USING COATED LEADFRAME AND SOLVENT

FIELD OF THE INVENTION

This invention relates to processes for producing semiconductor devices, and more particularly to processes for producing hermetically sealed semiconductor devices in which electrical connection between a lead frame and a semiconductor element can be improved by removal of resin flash build up on the lead frame without damaging a resin molded section.

In another aspect, the invention relates to hermetically sealed semiconductor devices having good adhesion between a lead frame and a core-box resin molded section, excellent humidity resistance and high reliability.

BACKGROUND OF THE INVENTION

Hermetically sealed semiconductor devices as referred to above, such as solid state image sensing devices, photosensors or ultraviolet erasable EP-ROM, generally have a box-core hollow resin molded item, a lead frame, a semiconductor chip, bonding wires and a covering member.

Generally, such hermetically sealed semiconductor devices as mentioned above are produced hitherto by a so-called insert molding technique wherein a lead frame is first embedded in a mold and the lead frame is then integrated with a core-box hollow resin molded item by means of a resin which is injection or transfer molded in the mold.

In the insert molding technique, however, there was involved such a problem that because flashes of the resin are formed on the surface of the lead frame during the molding process, electrical connection between the lead frame and semiconductor element cannot be attained satisfactorily with ease.

In order to solve the above-mentioned problem, there has generally been adopted a process wherein a semiconductor element is electrically connected in advance onto a lead frame, followed by resin molding.

In this process, however, there was involved such a problem that functions of the semiconductor element is liable to be impaired, because the element is subjected to elevated temperature and impact at the time of molding.

Furthermore, there have been made various attempts to facilitate electrical connection between the lead frame and semiconductor element. For instance, such attempts include a procedure for removing the flashes by blasting abrasive grains, a procedure for dissolving and delaminating the flashes by using chemicals, and a procedure for removing the flashes by using a jet of liquid at high pressure (Japanese Patent L-O-P Publn. No. 1502033/1985).

In the above-mentioned blast finishing procedure, however, there was involved such a problem that because the surface of the resin molded section is damaged by blasting, said surface must be masked during the blasting and hence the production process becomes complicated. In the procedure using chemical, there was involved the same problem as in the case of the above-mentioned blast finishing procedure, that is, the flashes cannot be removed perfectly even though said flash can be delaminated and hence a further brushing procedure is required for perfectly removing the flashes, resulting in damage of the surface of the resin molded section. Furthermore, in the procedure using a jet of liquid at high pressure, there was involved such a problem that the use of a high pressure liquid jetting device of sophisticated structure having two jet nozzles is imperatively needed for removing the flashes attached to both surfaces of the lead frame.

In practicing the above-mentioned insertion molding, occurrence of foreign particles resulting from fillers contained in plastics or of foreign particles resulting from flashes of plastics is unavoidable, and if this condition proceeds, as it is, to the subsequent step, such foreign particles present will attach to the inner surface of a covering member of semiconductor device or to the surface of semiconductor element during said subsequent step. On that account, there is brought about such a serious problem that images appear with a noise or transmittance of ultraviolet ray decreases in such a semiconductor device as an image sensor using quartz plate or sapphire plate as a covering member of the semiconductor device or EP-ROM (Erasable and Programmable Read Only Memory).

In hermetically sealed semiconductor devices obtained by the above-mentioned insertion molding technique, moreover, there was involved such a problem that if adhesion between a lead frame and a core-box hollow resin molded item is poor, exterior humidity permeates inside the core-box hollow resin molded item through an adhesive interface between the lead frame and core-box hollow resin molded item and thereby causing a trouble of semiconductor element present therein, and thus the resulting semiconductor devices are found to be less reliable.

As a measure to solve such problems mentioned above, it has heretofore been known to prepare a core-box hollow resin molded item by using resins improved in physical properties or to use a lead frame treated with certain kinds of chemicals. For instance, there are processes in which a core-box hollow resin molded item equipped with a lead frame is formed by using a resin incorporated with a rubber component so that an internal stress of the resulting core-box hollow resin molded item is reduced, and thereby to improve adhesion between the core-box hollow resin molded item and the lead frame, a process in which a core-box hollow resin molded item equipped with a lead frame is formed by using a resin incorporated with a silane coupling agent, and thereby to improve adhesion between the core-box hollow resin molded item and the lead frame, and a process in which a core-box hollow resin molded item equipped with a lead frame is formed by using the lead frame treated with a silane coupling agent, and thereby to improve adhesion between the lead frame and the core-box hollow resin molded item.

All the processes as mentioned above, however, involved such a problem that moldability, particularly releasing characteristics, of the resin used is unsatisfactory. Further, the process using the lead frame treated with the silane coupling agent involved such a problem that said process becomes complicated.

OBJECT OF THE INVENTION

The present invention is intended to solve such problems as mentioned above, and an object of the invention is to provide processes for producing semiconductor devices, by which resinous flashes formed on a lead frame are removed therefrom without damaging the resin molded section and thereby to improve electrical connection between the lead frame and semiconductor element and, at the same time, removal operation of the resinous flashes formed in a plurality of semiconductor devices can effectively be performed simultaneously.

In another aspect, a further object of the invention is to provide highly reliable semiconductor devices requiring no complicated production process, having good adhesion between the lead frame and core-box hollow resin molded item and excellent humidity resistance.

SUMMARY OF THE INVENTION

In a process for producing a semiconductor device equipped with a semiconductor element, a lead frame and bonding wires electrically connecting electrodes of said semiconductor element to said lead frame, and comprising a core-box resin molded item having a concavity in which said semiconductor element is received and a covering member sealing hermetically the whole concavity of said core-box resin molded item, the first process according to the invention comprises involving the following steps in sequence:

a step of obtaining the core-box resin molded item integrated with the lead frame by coating the portions of said lead frame expected to be in non-contact with said core-box resin molded item with an organic high molecular substance having a melting or softening point higher than a molding temperature of the resin of the core-box resin molded item and soluble in a solvent which does not dissolve said core-box resin molded item, placing said lead frame in position within a mold, and injecting said resin into said mold thereby carrying out injection or transfer molding, a step of immersing the core-box resin molded item equipped with the lead frame obtained in the foregoing step in said solvent and thereby to dissolve and remove said organic high molecular substance coated on the lead frame, a step of die bonding said semiconductor element to an island of said lead frame and then wire bonding electrodes of said semiconductor elements to said lead frame, and a step of adhesively or fusion bonding said covering member to said core-box resin molded item to seal hermetically the whole concavity of the core-box resin molded item.

In a process for producing a semiconductor device equipped with a semiconductor element, a lead frame and bonding wires electrically connecting electrodes of said semiconductor element to said lead frame, and comprising a core-box resin molded item having a concavity in which said semiconductor element is received and a covering member sealing hermetically the whole concavity of said core-box resin molded item, the second process according to the invention comprises involving the following steps in sequence:

a step of obtaining the core-box resin molded item integrated with the lead frame by placing said lead frame in position within the mold and injecting the resin into said mold thereby carrying out injection or transfer molding, a step of immersing the core-box resin molded item equipped with the lead frame in a liquid and subjecting it to ultrasonic vibration treatment and thereby to remove particles attached to said core-box resin molded item and flashes formed on said lead frame, a step of die bonding said semiconductor element to an island of said lead frame and then wire bonding electrodes of said semiconductor element to said lead frame, and a step of adhesively or fusion bonding said covering member to said concavity of said core-box resin molded item to seal hermetically the whole concavity of the core-box resin molded item.

A first semiconductor device according to the invention comprises a semiconductor element, a lead frame and bonding wires electrically connecting the electrodes of said semiconductor element and said lead frame, and further comprises a core-box resin molded item having a concavity in which said semiconductor element is received and a covering member sealing hermetically the whole concavity of said core-box resin molded item, wherein a difference in linear expansion coefficient between said lead frame and core-box resin molded item is less than $100 \times 10^{-7}$ cm/cm.°C.

The first semiconductor device according to the invention can be prepared by a process which comprises involving the following steps in sequence:

a step of obtaining a lead frame bearing core-box resin molded item having a difference in linear expansion coefficient between said lead frame and said lead frame bearing core-box resin molded item of less than $100 \times 10^{-7}$ cm/cm.°C. by placing in position a lead frame having a linear expansion coefficient of from $50 \times 10^{-7}$ to $200 \times 10^{-7}$ cm/cm.°C. within a mold, and injection molding the resin into the mold, a step of die bonding said semiconductor element to an island of the lead frame and then wire bonding the electrodes of said semiconductor element to said lead frame, and a step of adhesively or fusion bonding the covering member to the concavity of said core-box resin molded item to seal hermetically the whole concavity of said core-box resin molded item.

Figure 1:
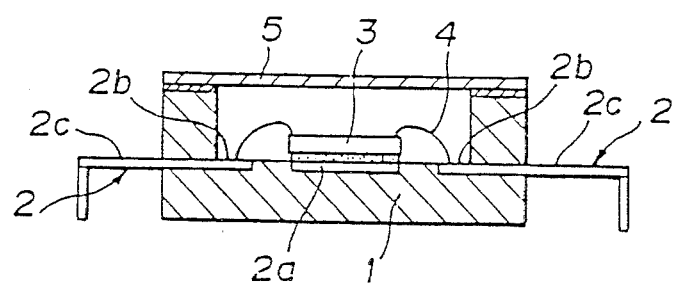
FIGS. 1 and 2 are rough sketches showing constructions of the semiconductor devices obtained by the processes according to the present invention.
Figure 2:
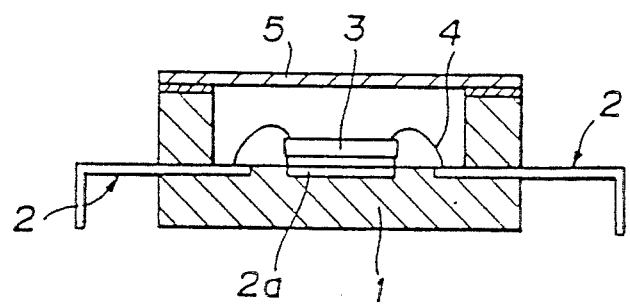

The following are reference numerals indicated in FIGS. 1 and 2:

1: Core-box resin molded item;
2: Lead frame;
2a: Expected non-contact portion (Island of lead frame);
2b: Expected non-contact portion (Internal lead of lead frame);
2c: Expected non-contact portion (External lead of lead frame);
3: Semiconductor element;
4: Bonding wire; and
.5: Covering member.

DETAILED DESCRIPTION OF THE INVENTION

The processes for producing semiconductor devices of the present invention and the semiconductor devices obtained thereby are illustrated below in detail.

FIG. 1 is a rough sketch showing a construction of the semiconductor device obtained by the first process for producing semiconductor devices of the present invention.

In a first step of the first process for producing the semiconductor device of the present invention, a core-box resin molded item 1 integrated with a lead frame 2 is first obtained by insert molding technique. In that case, before or after placing the lead frame 2 in position within a mold, portions 2a, 2b and 2c of the lead frame 2 expected to be in non-contact with the core-box resin molded item 1 are coated with an organic high molecular substance soluble in a solvent which does not dissolve the core-box resin molded item 1, and then a resin in injected into the mold thereby carrying out injection or transfer molding.

Concrete examples of the organic high molecular substance used in the present invention includes thermoplastic resins such as polysulfones (PS), polyether sulfones, polyether ether ketones, polyphenylene oxides, polyvinyl alcohols, acrylic resins and cellulose derivatives; thermosetting resins such as epoxy resins, polyimide resins and phenolic resins or precured products of these thermosetting resins. Of these organic high molecular substances mentioned above, preferred are cellulose derivatives, epoxy resins and polyimide resins.

In the present invention, there is used the lead frame 2 coated with the above-mentioned high molecular substance on the portions thereof expected to be in non-contact with the core-box resin molded item 1, and this coating operation may be carried out, for example, by screen printing or by means of computer-controlled dispensers.

Useful resins for constituting the core-box resin molded item 1 are thermosetting resins having good adhesion to the lead frame 2, for example, epoxy resins of such types as bisphenol A, novolak and glycidylamine, and imide resins such as polyaminobismaleimide and polypyromellitic imide. These resins may contain curing agents, curing accelerators, fillers and the like.

In the present invention, the aforesaid insert molding is carried out usually under conditions as a pressure of 10–500 kg/cm$^2$ and a temperature of 150°–250° C., though these conditions may vary depending upon the kind of resin used.

In a second step of the first process for producing the semiconductor device of the present invention, the lead frame bearing core-box resin molded item 1 obtained in the foregoing step is immersed in the aforesaid solvent to dissolve and remove the organic high molecular substance coated on the lead frame 2. In the present invention, the solvent used dissolves the organic high molecular substance coated on the lead frame 2 without dissolving the core-box resin molded item 1 obtained by insert molding. Concrete examples of such solvent as mentioned above include toluene, xylene, ethyl acetate, butyl acetate, acetone, methyl ethyl ketone, methylene chloride, trichloroethylene, dimethylformamide, N-methyl pyrrolidone and the like. In actual practice, however, the solvent used is suitably selected from among those illustrated above according to the kind of the resin used for constituting the core-box resin molded item and of the organic high molecular substance coated on the lead frame. For instance, methylene chloride or trichloroethylene is used suitably as the solvent when the resin constituting the core-box resin molded item is polyaminobismaleimide and the organic high molecular substance is polysulfone.

In the present invention, when the core-box resin molded item 1 is prepared by insert molding, flashes of the resin formed thereby come to be placed on the organic high molecular substance coated in advance on the lead frame 2, or this organic high molecular substance as coated in advance will act as a sealing agent to prevent the formation of said flashes. Accordingly, the flashes can be removed without damaging the resin molded portion by removal of the organic high molecular substance coated in advance of the lead frame 2.

In a third step of the first process for producing the semiconductor device of the present invention, a semiconductor element 3 is die bonded to an island 2a of the lead frame and then electrodes of the semiconductor 3 are wire bonded to the lead frame 2.

By virtue of the above-mentioned die bonding, the island 2a of the lead frame and the semiconductor element 3 are electrically connected to each other, and by virtue of the above-mentioned wire bonding, each of the electrodes of the semiconductor element 3 and the lead frame 2 are electrically connected to each other via a bonding wire 4 which may be composed of gold or aluminum.

In the first process for producing the semiconductor device of the present invention as illustrated up to this point, because the above-mentioned electrical connection is carried out after the formation of the core-box resin molded item 1, the semiconductor element 3 will not undergo high temperature and impact at the time of molding the core-box resin molded item 1 as in the case with the prior art processes, and accordingly the semiconductor element 3 can retain and exhibit its essential functions.

Finally, in a fourth step of the first process for producing the semiconductor device of the present invention, a covering member 5 is adhesively bonded to the aforesaid core-box resin molded item 1 so as to seal hermetically the whole concavity.

The covering member 5 used in the present invention is not particularly limited but includes those conventionally known. Concrete examples of the covering member 5 includes transparent covering members such as quartz glass plate, sapphire plate, transparent alumina plate, transparent plastic plate, etc., and opaque covering members such as colored glass plate, ceramics plate such as alumina, colored plastics plate, etc.

Adhesives used in the present invention for bonding the above-mentioned covering member 5 to the core-box resin molded item 1 include, for example, epoxy adhesives, imide adhesives and acrylic adhesives. These adhesives also have function as a sealing agent.

In the process for producing semiconductor devices as illustrated above, it is desirable that as will be mentioned later, there are used such lead frame and core-box resin molded item, the difference in linear expansion coefficient therebetween is less than $100 \times 10^{-7}$ cm/cm.°C., and that a linear expansion coefficient of the lead frame used is from $50 \times 10^{-7}$ to $200 \times 10^{-7}$ cm/cm.°C. and that of the core-box resin molded item used is from $100 \times 10^{31\ 7}$ to $250 \times 10^{-7}$ cm/cm.°C.

Further, in the above-mentioned second step, when the lead frame bearing core-box resin molded item 1 is immersed in the solvent to remove the organic high molecular substance and flashes formed thereon from the lead frame 2, ultrasonic vibration treatment may be applied thereto under such conditions as will be mentioned later.

According to the first process for producing the semiconductor device of the present invention as illustrated above, good electrical connection between the lead frame and semiconductor element can be accomplished by easily removing any resin flashes from the lead frame without damaging the resin molded portion, or by suppressing the formation of such flashes.

The second process for producing the semiconductor device of the present invention is illustrated.

FIG. 2 is a rough sketch showing a construction of semiconductor device obtained by the second process for producing the semiconductor device of the present invention.

In a first step of the second process for producing the semiconductor device of the present invention, a core-box resin molded item integrated with a lead frame 2 is obtained by insert molding. The procedures and conditions employed in the insert molding are the same as in the first process for producing the semiconductor device of the present invention.

In the second process for producing the semiconductor device of the present invention, it is desirable that molding the core-box resin molded item 1 is terminated at a stage when the aforementioned thermosetting resin reaches a degree of cure in the range of 10-70%, preferably 20-50%. In this case, postcure of the core-box resin molded item 1 is carried out in an oven after the completion of a second step of this process. By "degree of cure" as used in the present specification is meant a percentage of torque value of the core-box resin molded item 1 at a given molding time to the maximum torque value reached at the time when said core-box resin molded item 1 is measured at a given molding temperature by means of a curastometer.

In a second step of the second process for producing the semiconductor device of the present invention, the lead frame bearing core-box resin molded item 1 obtained in the foregoing step is immersed in a liquid and subjected to ultrasonic vibration treatment to remove particles attached to this core-box resin molded item 1 and flashes formed on the lead frame 2.

The liquid used in the second stp above is an inert solvent which does not dissolve the thermosetting resin constituting the core-box resin molded item 1, and this liquid plays the role of a rinsing liquid in the ultrasonic vibration treatment. Concrete examples of the liquid mentioned above include water, alcohols such as methanol, ethanol, propanol, etc., ketones such as acetone, methyl, ethyl ketone, methyl isobutyl ketone, or halogenated hydrocarbons such as trichloroethane, trichloroethylene, perchloroethylene, trichlorotrifloroethane, tetrachlorodifloroethane, etc. In actual practice, the liquid is suitably selected from among these solvents illustrated above according to the kind of the resin constituting the core-box resin molded item. For instance, trichloroethylene or the like is suitably used when the resin constituting the core-box resin molded item is polyaminobismaleimide, and methyl ethyl ketone or the like is suitably used when said resin is an epoxy resin.

A frequency of ultrasonic wave used in the above-mentioned ultrasonic vibration treatment is from 10 to 2,000 kHz, and it is desirable that a ultrasonic wave having a frequency of 10-100 kHz is used in the first stage of ultrasonic vibration treatment, and a ultrasonic wave having a frequency of 500-2,000 kHz is used in the second stage of ultrasonic vibration treatment.

Other conditions under which the above-mentioned ultrasonic vibration treatment is carried out are such that the output is 10-100 W per 1 liter of the volume of the treatment bath, the temperature of the aforementioned rinsing liquid used ranges from ordinary temperature up to a boiling point of said liquid, and the treatment bath used is capable of circulation filtering said rinsing liquid by using a precision filter membrane having a pore diameter of 0.1-1 $\mu$m and also capable of circulating said rinsing liquid corresponding to 10-50% of the capacity of the treatment bath per 1 minute.

By virtue of the above-mentioned ultrasonic vibration treatment, flashes of the resin formed on the lead frame 2 at the time of producing the core-box resin molded item 1 by insert molding, particles (dust) resulting from the filler contained in the resin and particles (dust) resulting from flashes of the resin can be removed from the core-box resin molded item 1 without damaging the resin molded portion.

In a third step of the second process for producing the semiconductor device of the present invention, a semiconductor element 3 is die bonded to an island 2a of the lead frame, and then electrodes of said semiconductor element 3 are wire bonded to the lead frame 2 in the same manner as in the first process for producing the semiconductor device.

In the second process for producing the semiconductor device of the present invention, the above-mentioned electrical connection is also carried out after molding the core-box resin molded item 1, and hence the semiconductor element 3 will not undergo high temperature and impact at the time of molding the core-box resin molded item 1 as in the case of the prior art processes. Accordingly, the semiconductor element 3 can retain and exhibit its essential functions as expected.

Finally, in a fourth step of the second process for producing the semiconductor device of the present invention, a covering member 5 is adhesively or fusion bonded to said core-box resin molded item 1 and thereby to seal hermetically the whole concavity of the core-box resin molded item 1.

According to the second process for producing the semiconductor device of the present invention as illustrated hereinbefore, there is obtained such an effect that a good electrical connection between the lead frame and semiconductor element can be attained, because flashes of the resin formed on the lead frame and particles (dust or resin or the like) attached to the core-box resin molded item can be removed simultaneously with facility without damaging the resin molded portion.

Furthermore, the removal treatment method in the present invention has such an effect that because the method does not require complicated steps, flashes of the resin and particles (dust or resin or the like) attached to the core-box resin molded item in a plurality of semiconductor devices can be removed at the same time.

The first semiconductor device of the present invention and the process for producing the same are illustrated hereinafter.

The first semiconductor device of the present invention is as shown in FIG. 2, in which the lead frame 2 used is a metallic lead frame having a linear expansion coefficient of from $50 \times 10^{-7}$ to $200 \times 10^{-7}$ cm/cm.°C., preferably from $70 \times 10^{-7}$ to $180 \times 10^{-7}$ cm/cm.°C.

The metallic lead frame as referred to above includes, for example, those of iron-copper alloys having a linear expansion coefficient of $160 \times 10^{-7}$ to $170 \times 10^{-7}$ cm/cm.°C., those of copper alloys such as phosphor bronze, having a linear expansion coefficient of $170 \times 10^{-7}$ to $180 \times 10^{-7}$ cm/cm.°C., and those of iron alloys, for example, that of 42 nickel-iron having a linear expansion coefficient of $70 \times 10^{-7}$ cm/cm.°C. and that of 52 nickel-iron having a linear expansion coefficient of $100 \times 10^{-7}$ cm/cm.°C. Above all, the lead frames of copper alloys are preferably used.

The bonding wire 3 used includes, for example, a gold wire and aluminum wire.

The first semiconductor device of the invention comprises the core-box resin molded item 1 having a concavity in which the semi-conductor 3 is received, and said core-box resin molded item 1 used include those having a linear expansion coefficient of from $100 \times 10^{-7}$ to $250 \times 10^{-7}$ cm/cm.°C., for example, core-box resin molded items molded from epoxy resins or imide resins containing fillers such as silica and alumina.

In the first semiconductor device of the invention, the lead frame 2 and the core-box resin molded item 1 used are selected so that the difference in linear expansion coefficient between said lead frame 2 and said core-box resin molded item 1 is less than $100 \times 10^{-7}$ cm/cm.°C., preferably less than $50 \times 10^{-7}$ cm/cm.°C.

Because the difference in linear expansion coefficient between the lead frame 2 and the core-box resin molded item 1 is less than $100 \times 10^{-7}$ cm/cm.°C., the first semiconductor device of the present invention has good adhesion between the lead frame 2 and the core-box resin molded item 1, good moisture resistance and high reliability.

In the first semiconductor device of the invention, the covering member used includes those as mentioned previously.

The process for producing the first semiconductor of the present invention is illustrated as a third process for producing the semiconductor device of the invention hereinafter.

In a first step of the third process for producing the semiconductor device of the invention, a resin is injected into a mold where a lead frame 2 having a linear expansion coefficient of from $50 \times 10^{-7}$ to $200 \times 10^{-7}$ cm/cm.°C. is placed in position and thereby to obtain a lead frame bearing core-box resin molded item 1 having a difference in linear expansion coefficient between the lead frame 2 and said core-box resin molded item 1.

In the present invention, the above-mentioned core-box resin molded item 1 is formed usually at a pressure of 1-500 kg/cm² and a temperature of 100°-250°C., through these conditions may vary according to the kind of the resin used therefor.

In a second step of the third process for producing the semiconductor device of the invention, a semiconductor element 3 is die bonded to an island 2a of the lead frame 2, and then electrodes of said semiconductor element 3 are wire bonded to the lead frame 2.

By virtue of the above-mentioned die bonding, the island 2a of the lead frame 2 and the semiconductor element 3 are electrically connected to each other, and by virtue of the above mentioned wire bonding, each of the electrodes of the semiconductor element 3 and the lead frame 2 are electrically connected to each other via the bonding wire such as a gold wire or aluminum wire.

Finally, in a third step of the third process for producing the semiconductor device of the invention, a covering member 5 is adhesively bonded to the core-box resin molded item 1 so as to seal hermetically the whole concavity of said core-box resin molded item 1.

In the present invention, an adhesive used in bonding the covering member 5 to the core-box resin molded item 1 includes epoxy adhesives, imide adhesives and acrylic adhesives.

The first semiconductor device of the present invention produced by the process as illustrated hereinbefore has a good adhesion between the lead frame and the core-box resin molded item, excellent humidity resistance and high reliability, because said semiconductor device comprises the lead frame having a specific linear expansion coefficient and the core-box resin molded item having a specific linear expansion coefficient, wherein the difference in linear expansion coefficient between said lead frame and said core-box resin molded item is less than $100 \times 10^{-7}$ cm/cm.°C.

In the third process for producing the semiconductor device of the present invention, a highly reliable semiconductor device having a good adhesion between a lead frame and a core-box resin molded item and excellent humidity resistance is obtained without deteriorating moldability of the resin used and without complicating the production step, because the lead frame bearing core-box resin molded item is designed to be formed from the lead frame having a specific linear expansion coefficient and the core-box resin molded item having a specific linear expansion coefficient.

For instance, a semiconductor device excellent in humidity resistance is obtained when it is produced by the following process.

That is, a core-box resin molded item was obtained by transfer molding an epoxy type molding material having a linear expansion coefficient of $160 \times 10^{-7}$ cm/cm.°C. under conditions of 170°C., 60 kg/cm² and 3 minutes in a mold where a lead frame made of a copper alloy (JIS Alloy No. C19400) having a linear expansion coefficient of $177 \times 10^{-7}$ cm/cm.°C. had been placed in position. Subsequently, the core-box resin molded item integrated with the lead frame was cured at 170° C. for 4 hours in an oven, and thereafter a solid image forming element was die bonded to an island of the lead frame, followed by wire bonding of electrodes of the element to the lead frame.

Subsequently, a transparent glass covering member coated with an epoxy adhesive was pressed to fix to the core-box resin molded item so as to seal the concavity of the core-box resin molded item, followed by curing the adhesive by heating in an oven at 120° C. for 60 minutes and then at 150° C. for 90 minutes.

The solid stage image sensing device thus obtained was submitted to pressure cooker test (PCT) in saturated water vapor of 121° C. and 2 kg/cm², whereby sweating took place on the inner wall of the concavity of the core-box resin molded item after the lapse of 340 hours.

In contrast thereto, a solid image forming device was produced by the same procedure as above except that the lead frame used was a lead frame made of nickel-cobalt-iron alloy having a linear expansion coefficient of $46 \times 10^{-7}$ cm/cm.°C. This solid state image sensing device was also submitted to PCT in the same manner as above, whereby sweating took place on the inner wall of the concavity of the core-box resin molded item after the lapse of 48 hours.

What is claimed is:

1. A process for producing a semiconductor device which is received in a concavity of a core-box resin molded item, said process comprising the steps of:

coating a lead frame on its portions expected to be in non-contact with said core-box resin molded item with an organic high molecular substance having a melting or softening point higher than the molding temperature of a resin constituting said one-box resin molded item and soluble in a solvent which does not dissolve said core-box resin molded item, the organic high molecular substance being selected from the group consisting or cellulose derivatives and epoxy resins;

placing the thus coated lead frame in position within a mold and injecting said resin into said mold, thereby obtaining the core-box resin molded item integrated with the lead frame;

immersing the lead frame of the core-box resin molded item into said solvent to dissolve said organic high molecular substance coated on said lead frame;

die-bonding said semiconductor element to an island of said lead frame and then wire bonding electrodes of said semiconductor element to said lead frame; and fusion-bonding a covering member of said core-box resin molded item to seal hermetically the whole concavity of said core-box resin molded item.

2. The process for producing a semiconductor device as claimed in claim 1 wherein a difference in linear expansion coefficient between the lead frame and the core-box resin molded item is less than $100 \times 10^{-7}$ cm/cm.°C.

3. The process for producing a semiconductor device as claimed in claim 1 wherein the lead frame is made of a copper alloy.

4. The process for producing a semiconductor device as claimed in claim 1 wherein the lead frame has a linear expansion coefficient of from $50 \times 10^{-7}$ to $200 \times 10^{-7}$ cm/cm.°C.

5. The process for producing a semiconductor device as claimed in claim 1 wherein the organic high molecular substance coated on the lead frame of the lead frame bearing core-box resin molded item is dissolved therefrom by immersing the lead frame in the solvent and subjecting the lead frame to ultrasonic vibration.

6. The process for producing a semiconductor device as claimed in claim 5 wherein the liquid used is selected from the group consisting of water, alcohols, ketones and halogenated hydrocarbons.

7. The process for producing a semiconductor device as claimed in claim 5 wherein the ultrasonic vibration treatment is carried out by two stages involving vibration with an ultrasonic wave having a frequency of 10-100 KHz and then with an ultrasonic wave having a frequency of 500-2,000 KHz.

8. A process for producing a semiconductor device having a semiconductor element which is received in a concavity of a core-box resin molded item, said process comprising the steps of:

placing in position a lead frame having a linear expansion coefficient of from $50 \times 10^{-7}$ to $200 \times 10^{-7}$ cm/cm.°C. within a mold, and injecting the resin into said mold, thereby obtaining the core-box resin molded item integrated with the lead frame, a difference in linear expansion coefficient between the lead frame and the core-box resin molded item being less than $100 \times 10^{-7}$ cm/cm.°C.;

die-bonding said semiconductor element to an island of the lead frame and then wire bonding electrodes of said semiconductor element to said lead frame; and fusion-bonding a covering member to the concavity of said core-box resin molded item to seal hermetically the whole concavity of said core-box resin molded item.

9. The process for producing a semiconductor device as claimed in claim 8 wherein the lead frame is made of a copper alloy.

10. The process for producing a semiconductor device as claimed in claim 1 wherein the core-box resin molded item is made of a thermosetting resin selected from the group consisting of epoxy resins and imide resins.

11. The process for producing a semiconductor device as claimed in claim 2 wherein the lead frame is made of a copper alloy.

12. The process for producing a semiconductor device as claimed in claim 4 wherein the lead frame is made of a copper alloy.

* * * * *